United States Patent [19]

Berger et al.

[11] 4,453,177

[45] Jun. 5, 1984

[54] COLOR TELEVISION CAMERA

[75] Inventors: Jean L. Berger; Pierrick Descure, both of Paris, France

[73] Assignee: Thomson-CSF, Paris, France

[21] Appl. No.: 361,722

[22] Filed: Mar. 25, 1982

[30] Foreign Application Priority Data

Mar. 31, 1981 [FR] France ............................. 81 06432

[51] Int. Cl.³ .............................................. H04N 9/07
[52] U.S. Cl. .......................................... 358/44; 358/48
[58] Field of Search ................ 358/44, 48; 357/24 LR

[56] References Cited

U.S. PATENT DOCUMENTS

| 4,016,550 | 4/1977 | Weimer | 357/24 LR |
| 4,047,203 | 9/1977 | Dillon | 358/44 |
| 4,271,428 | 6/1981 | Herbst | 358/75 |

FOREIGN PATENT DOCUMENTS

| 0038725 | 10/1981 | European Pat. Off. . |
| 2314584 | 1/1977 | France . |
| 2367353 | 5/1978 | France . |
| 2376517 | 7/1978 | France . |
| 2001504 | 1/1979 | United Kingdom . |

Primary Examiner—John C. Martin
Assistant Examiner—Jeffrey D. Sutherland
Attorney, Agent, or Firm—Roland Plottel

[57] ABSTRACT

A device for electrically analyzing color light images includes:
- a matrix of photosensitive points each able to receive a colored filter,
- an assembly of two line memories receiving in parallel the electric charges from a line of the matrix,
- two shift registers receiving in parallel respectively the charges supplied by the two line memories.

This device applies more particularly to a television camera.

18 Claims, 12 Drawing Figures

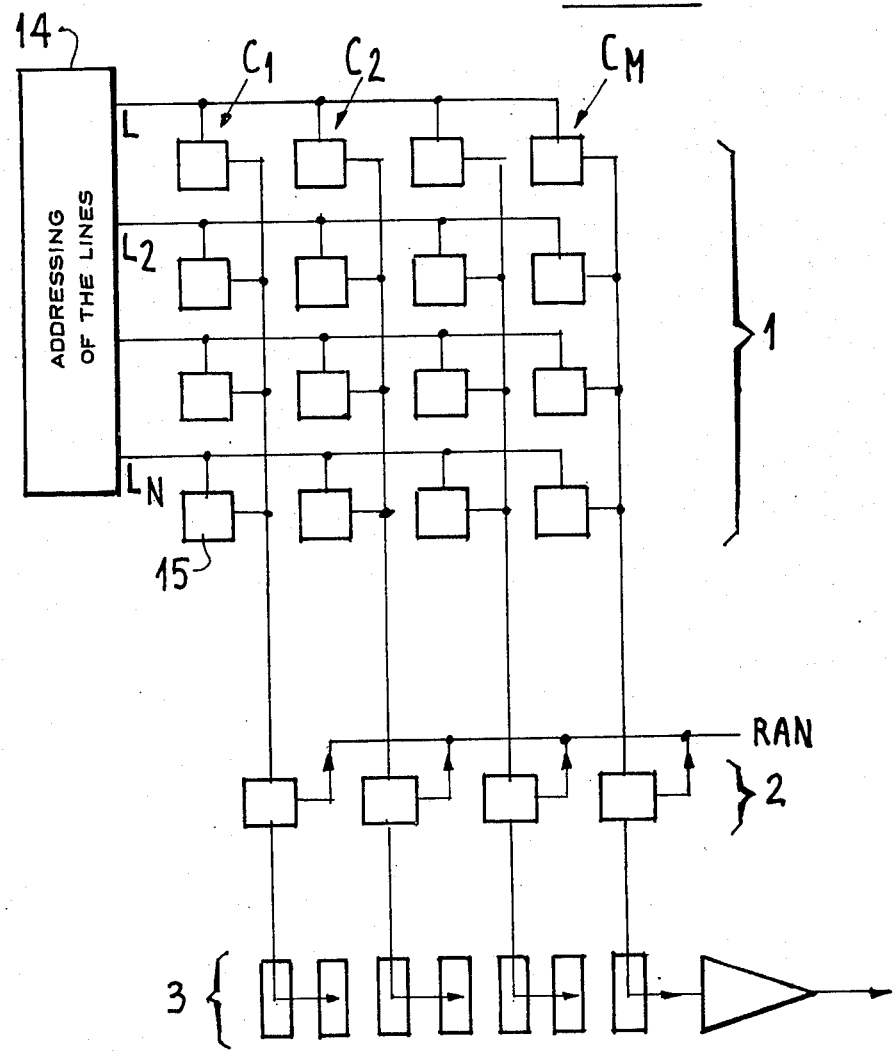
FIG_1
PRIOR ART

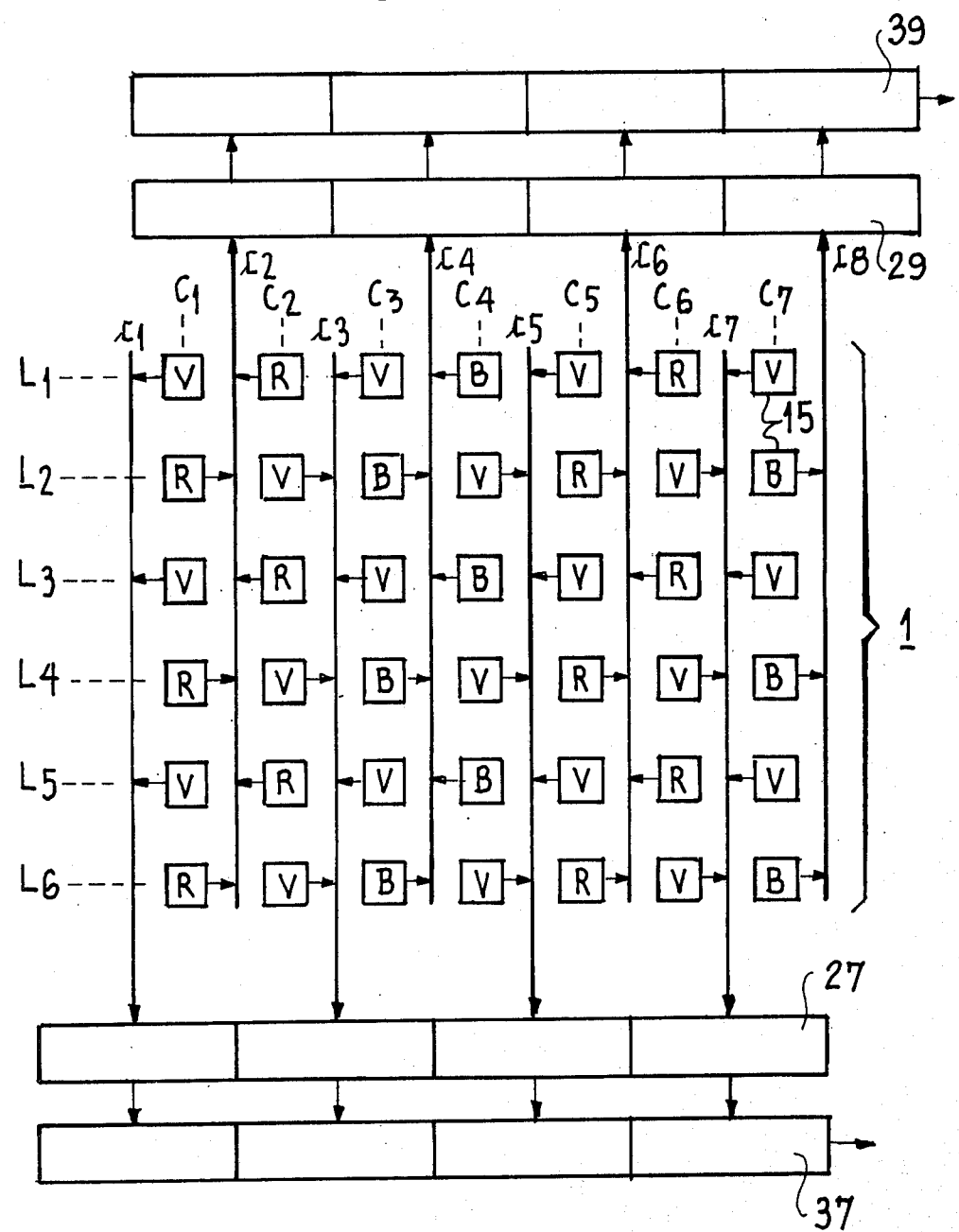
FIG_2

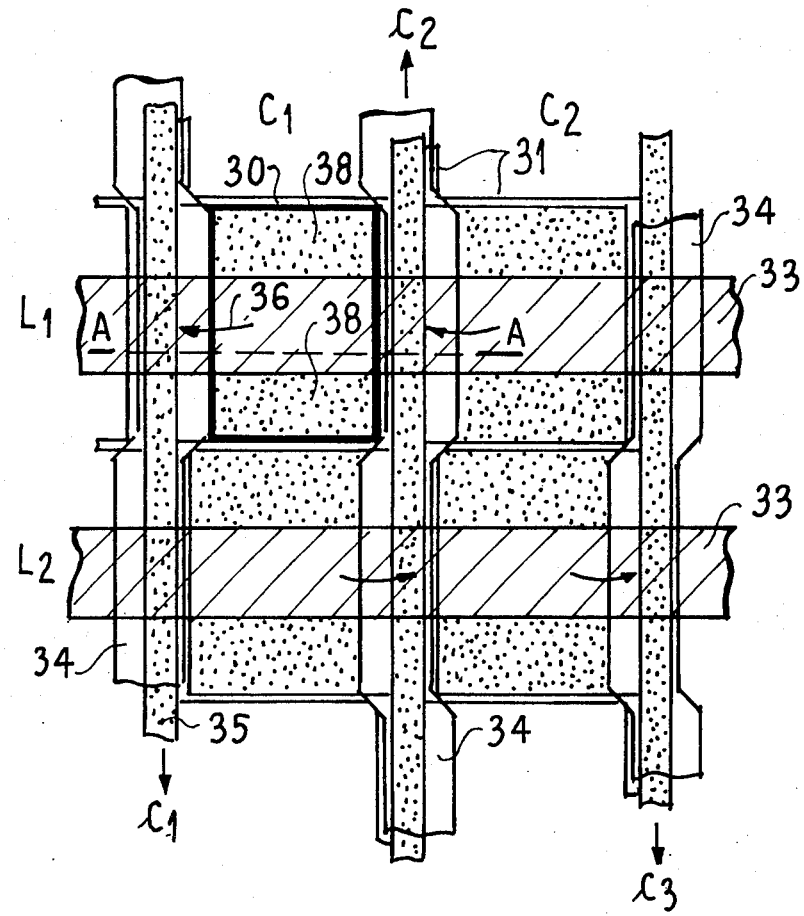
FIG_3-a
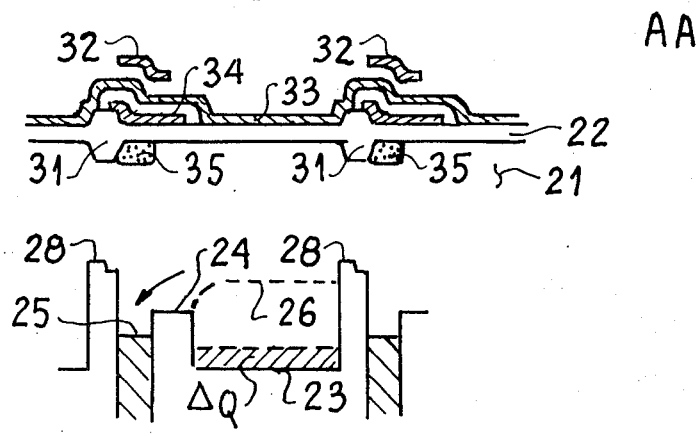
FIG_3-b

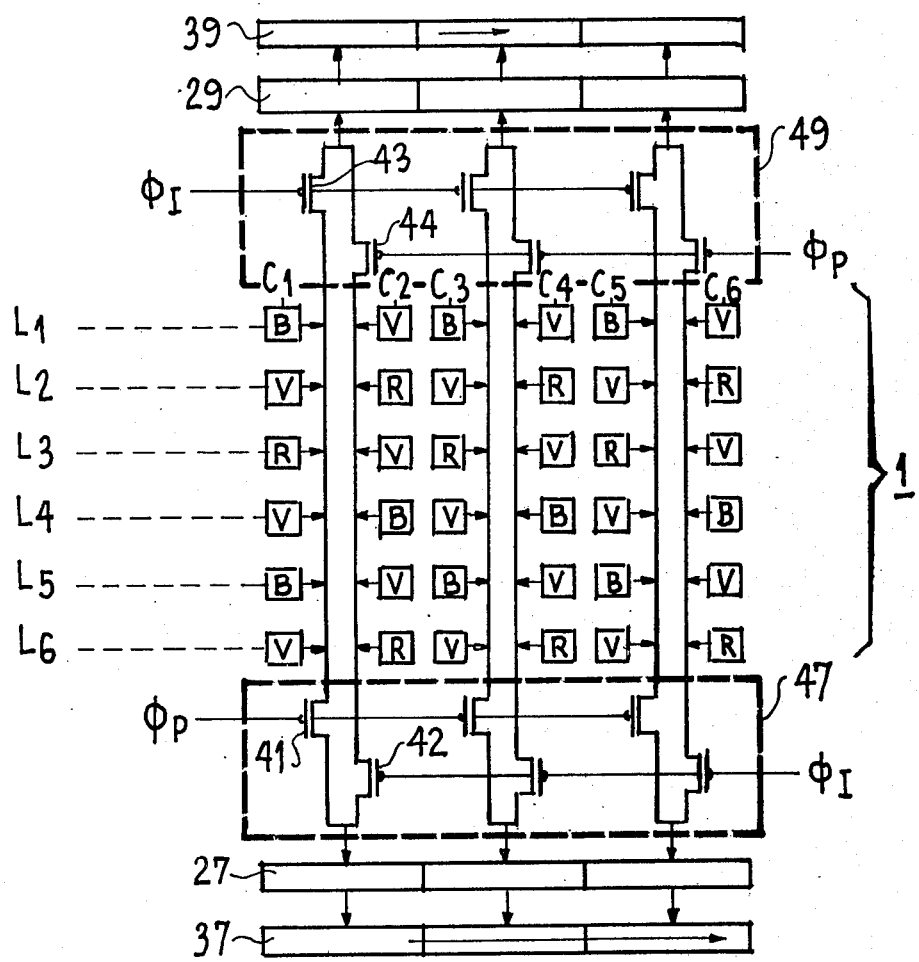
FIG_4·a
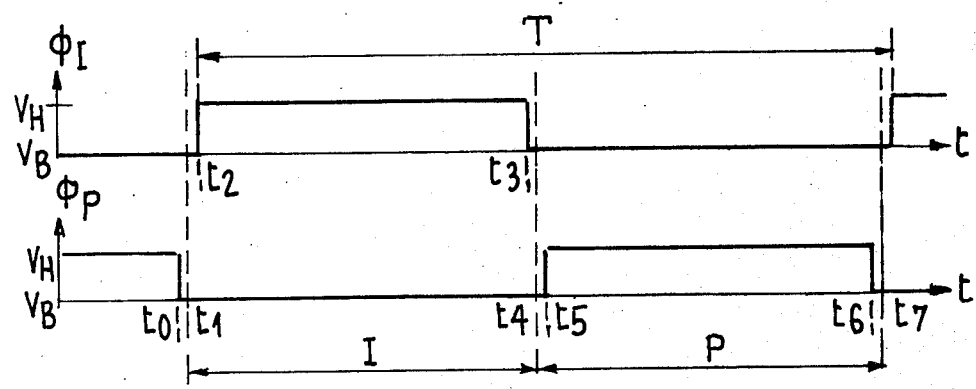
FIG_4·b

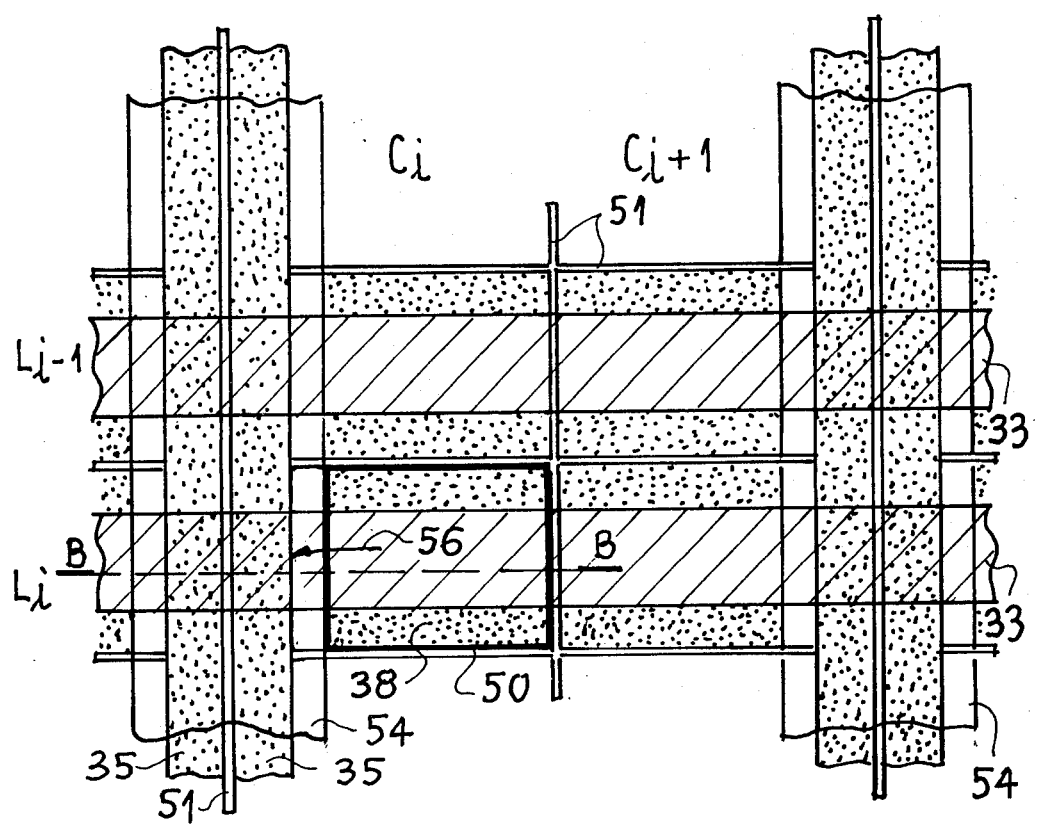
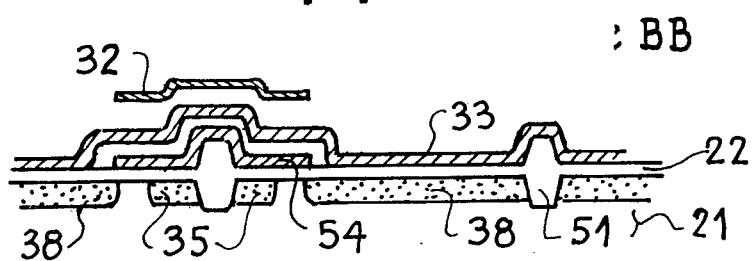

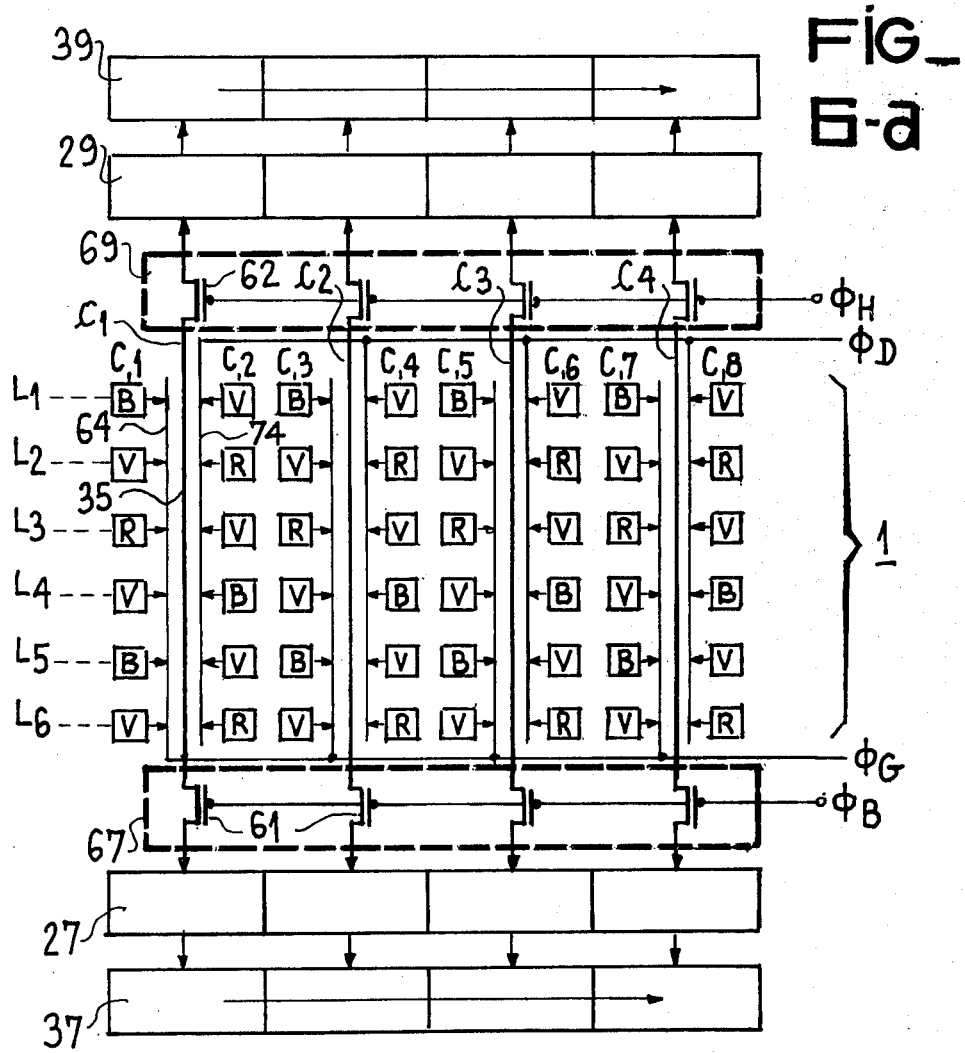
FIG_6-a
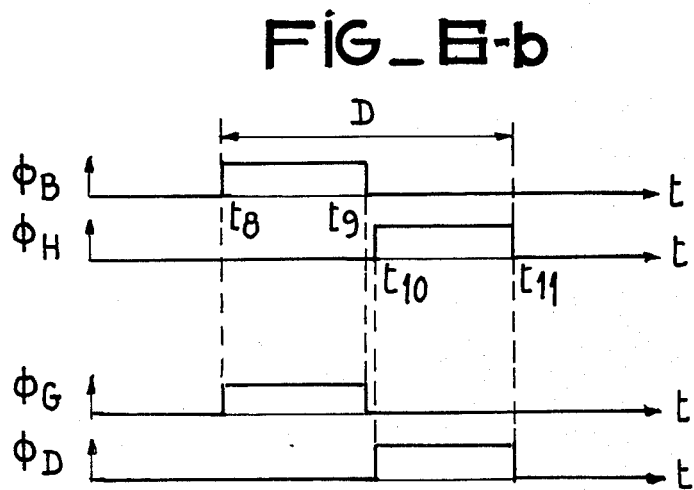
FIG_6-b

FIG_7-a
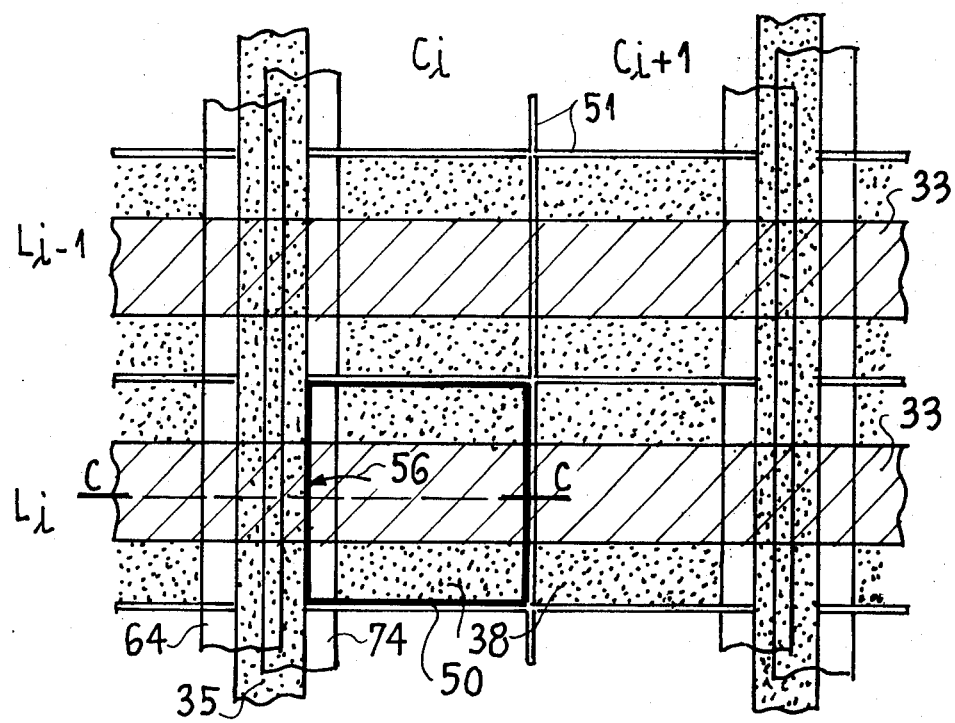
FIG_7-b
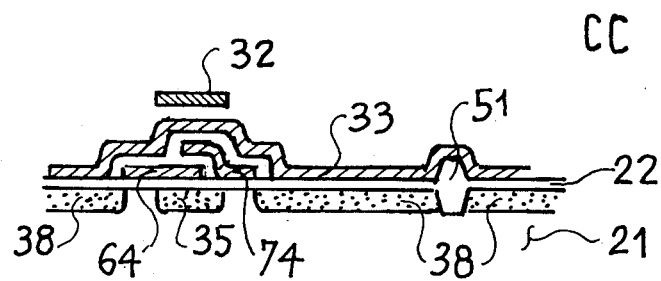

COLOR TELEVISION CAMERA

BACKGROUND OF THE INVENTION

The invention relates to the field of electric analysis of light images using charge transfer in a semiconductor; it has as object a device more particularly adapted to the analysis of color images.

Different solid state devices are known for analysing a light image, which are for use in a television camera for supplying a video electric signal. They are distinguished by the embodiment of the photosensitive zone on the one hand and the system for reading and removing the charges created by the image, on the other hand.

The use of charge transfer devices is already known for providing these different functions, as is described for example in the work by SEQUIN and TOMPSETT, entitled "Charge transfer devices", (pages 152 to 169);

in so-called "frame transfer" or "interline structure" organizations, in which the light radiation is received on charge transfer registers; in these devices, the charge transfer is carried out over large areas, which constitutes a disadvantage because it is at present difficult to obtain high outputs in the manufacture of these large surfaces;

in so-called "CID" devices (for "Charge injection devices") which do not present this drawback but which generally require reinjection of the charges into the semiconductor substrate, which presents a number of disadvantages among which noise and difficulties at the level of the values of the capacities required during or after reading of the charges.

More generally, in addition to the above-mentioned problems, there arises the question of the compatibility of the times required, on the one hand, for light integration and, on the other hand, for the transfer of the charges in the case where this solution is selected, with times for scanning the television screen which are, in the usual 625 line standard, about 52 $\mu$s for the display time of a line and 12 $\mu$s for the line return time.

To comply with these different requirements, the Applicant has proposed a so-called "line transfer" structure, described in French patent application No. 80-08112, which principally comprises:

a matrix of N lines×M zones, or photosensitive points, on to which matrix an image to be read is projected and converted into electric charges;

an M points memory, so-called line memory, intended to receive successively the signal charges stored by each line;

a shift register of the CCD type (for "charge coupled devices") receiving in parallel the contents of the line memory and delivering in series the electric analysis signal of the image.

SUMMARY OF THE INVENTION

The present invention provides improvements to the structure of the line transfer device described above, with the aim of adapting it to color image analysis.

To this end, the image analysis device of the invention comprises a photosensitive assembly, comprising:

a plurality of elementary photosensitive zones, called points, in which electric charges are created depending on the illumination received, formed on the same semiconductor substrate in N lines and M columns, isolated from each other and forming a matrix, each of these elementary zones comprising an MOS capacity, forming a first charge collection zone and comprising a grid which is common to the capacities of the same line, and a second charge collection zone, electrically coupled to the capacity, the whole of the point receiving a colored filter intended to make it sensitive only to a pre-defined color;

connection and control means, providing in parallel, through column connections, electric charges created in the M points of the same line, successively for the N lines, these means comprising a plurality of reading diodes, arranged in columns between the points so as to receive each one, successively, to order, the charges from at least two points belonging to two different lines;

means forming a screen for the charges, placed between each of the points and the connection means, these screen means comprising a plurality of grids, brought to a constant potential, arranged in columns between the reading diodes and the points;

an assembly of two memories of M points each one, called line memories, formed in the same semiconductor substrate, receiving in parallel the electric charges provided by the connection and control means so that each point in the matrix is assigned to one only of the two line memories, one of these memories being connected only to the points of the same color;

an assembly of two analog shift registers, receiving in parallel respectively the charges supplied by the two line memories and each one delivering in series an electric analysis signal of the image.

The invention also relates to a television camera comprising such an image analysis device.

BRIEF DESCRIPTION OF THE DRAWINGS

The invention is described by way of non-limiting example, in greater detail hereafter with reference to the accompanying figures which represent:

FIG. 1, the general organization of a line transfer structure;

FIG. 2, a first embodiment of the device of the invention;

FIG. 3a, a top view and FIG. 3b a sectional view of a photosensitive points matrix adapted to be used in the device of FIG. 2;

FIG. 4a, a second embodiment of the device of the invention and FIG. 4b signal diagrams relative to FIG. 4a;

FIG. 5a, a top view and FIG. 5b a sectional view of one embodiment of a photosensitive points matrix adapted for use in the device of FIG. 4a;

FIG. 6a, a variation of FIG. 4, and FIG. 6b signal diagrams relative to FIG. 6a;

FIG. 7a, a top view and FIG. 7b a sectional view of one embodiment of a photosensitive matrix able to be used in the device of FIG. 6a.

In these different figures, the same references refer to the same elements.

DESCRIPTION OF THE PREFERRED EMBODIMENTS

FIG. 1 shows then the general organization of a line transfer structure, such as described in the above-mentioned French patent application.

This structure comprises principally a photosensitive zone 1, a line memory 2 and an analog output shift register 3.

The photosensitive zone 1 receives the light image to be analysed and transforms it into electric charges. It should be noted that there is meant here by light image, the detection not only of the visible wave-lengths but also of those which surround them, more especially in the infrared. The photosensitive zone is formed by a plurality of elementary zones 15, also called hereafter points, arranged in N lines, referenced $L_1, L_2, \ldots L_N$, and M columns, referenced $C_1, C_2 \ldots C_M$ and forming a matrix. The photosensitive points of the same line are connected together and are connected to a control device 14, allowing the lines to be addressed one after the other; this device is formed for example by a shift register of the MOS type. The photosensitive points 15 of the same column are connected by the same connection, called hereafter column connection, to the line memory 2.

Line memory 2 receives then in parallel the charges created at each of the photosensitive points 15 of the same line, then it transfers them also in parallel to register 3, which is an analog shift register, of the CCD type and which then supplies information, received in parallel, in a series mode; this information forms the video analysis signal of the optical image received on photosensitive zone 1.

The sequencing of the different operations for integrating the image at the level of the photosensitive zone 1, for transferring lines into line memory 2, then for transferring signals into register 3 for the different lines, will now be described.

First of all, it should be noted that integration of the image is carried out continuously over the whole of the photosensitive matrix 1, except in that one of the lines which is addressed by register 14.

During the line return time, the contents of line memory 2 are transferred to shift register 3, the input of the line memory then being closed.

During the next line time, the contents of register 3 are removed in series, the connection between line memory 2 and register 3 is interrupted. During this time, there occurs in a first phase a zero-setting of the means for reading points 15, through the connection referenced RAN in FIG. 1, connected to line memory 2 and, in a second phase, the transfer of one of the lines L of zone 1 to line memory 2 is carried out, the selection (or "addressing") of a line being ensured by register 14.

The following step corresponds to the line return time during which the contents of line memory 2 are dumped in register 3, this latter having been entirely read during the preceding step.

In another embodiment, the selection of a line, its transfer to the line memory then to the shift register take place entirely during the line return time, the line time being reserved for re-levelling the reading means, which is all the better the longer it takes, and for the series removal of the contents of the shift register.

FIG. 2 shows a first embodiment of the device of the invention.

In this figure, the photosensitive matrix 1 is shown schematically by its elementary zones, or points 15, arranged in lines L (for example six lines $L_1$ to $L_6$ in the figure) and in columns C (for example seven columns from $C_1$ to $C_7$). Each of the photosensitive points is, as is known, for taking a color shot, covered with a color filter so that it only lets through one of three colors, for example green, red or blue; in the figure, the photosensitive points 15 are referenced R, V or B according to whether they detect red, green or blue. The filters are spaced apart in an interline staggered arrangement in which the V points, sensitive to green, called more simply "green points", are the most numerous because, as is known, it is these which give a maximum of sensitivity and so which are principally used for obtaining a luminance signal; moreover, the staggering, as is also known, increases the apparent resolution. This arrangement consists then in having a green point at every second photosensitive point in each line and in disposing these green points in a staggered arrangement from one line to the next; in each line, the remaining photosensitive points are alternately red or blue; thus, the repetition of the green-red-green-blue sequence is obtained.

The line memory 2 of FIG. 2 is here split up into two memories respectively 27 and 29, situated on each side of the photosensitive matrix 1. One of these line memories (27) is connected to the column connections of odd rank (referenced $c_1, c_3, c_5, c_7$ in the figure) whereas the other line memory (29) is connected to the column connections of even rank ($c_2, c_4, c_6$ and $c_8$). All the photosensitive points of the odd lines ($L_1, L_3, L_5$) are connected to a column connection which is on their left, all the photosensitive points of an even line ($L_2, L_4, L_6$) are connected to the column connection which is on their right with a line $L_1$ beginning by a green point, the column $c_1$ being situated on its left. Thus it can be seen that all the green points are connected to column connections of odd rank and so to the same memory line (27), the other photosensitive points being disposed so that the even column connections supply, some the red color (columns $c_2$ and $c_6$) and the others the blue color ($c_4$ and $c_8$).

To each of the line memories 27 and 29 there is connected in parallel an output register, respectively 37 and 39, similar to register 3 of FIG. 1. Thus, register 37, which is connected to memory 27, supplies an electric signal representing only the green color, which allows the luminance signal to be derived therefrom; register 39 supplies alternately the blue chrominance signal then the red chrominance signal, which may thus be easily separated downstream of the analysis device.

This structure, by providing reading of the charges in two different directions, facilitates then the elaboration of the luminance signal and separation of the chrominance components.

FIG. 3a shows an embodiment of a photosensitive points matrix adapted to be used in the device of FIG. 2.

In this figure there is shown, deposited on a semiconductor substrate (not shown), made from silicon for example, covered with an insulating layer made for example from silicon oxide, several parallel conducting deposits 33, called hereafter like the different conducting deposits of the device parallel electrodes or grids made from metal possibly semi-transparent or from polycrystalline silicon, representing the lines L of the matrix 1 of FIG. 2 (lines $L_1$ and $L_2$ of the preceding figure, for example) and forming with the semiconductor substrate and the insulation, MOS photodetecting capacities. Along the columns C of the matrix (for example $C_1$, $C_2$ and $C_3$) are placed grids 34, brought to a constant potential, which form a screen for the charges, according to a procedure described in more detail hereafter. The device further comprises under each of the screen grids 34 a strip 35 formed in the semiconductor substrate, by doping for example, forming a diode for reading the different photosensitive points connected to the column considered.

The different lines L and the different columns C are separated from each other by insulating barriers 31 in the form of crenels or square indentations, shown in the figure with a double line, whose horizontal parts are substantially in the middle of the space separating two grids 33 and whose vertical parts are alternately on the left or on the right of the screen grids 34, without passing therethrough. Each of the insulating barriers 31 may be formed by a local extra thickness of the insulating material, possibly accompanied by overdoping of the semiconductor substrate, of the same type of conductivity as this latter (for example, P+ overdoping for a P substrate), the overdoping being provided under the extra thickness of oxide.

There is shown for example with thick lines a photosensitive point referenced 30: it is limited horizontally by the insulating barrier 31, on one of its vertical sides (right hand side in the example of the figure) by the same insulating barrier and on its other vertical side by the screen grid 34. According to a procedure described below, point 30 is read by the column diode 35 situated on its left, as shown by arrow 36 in the figure. In the variation shown in the figure, each of the screen grids 34 is not in the form of a rectangular strip but slightly in the form of vertical crenels, like the insulating barriers 31 but of a much smaller amplitude, so as to allow a maximum of photosensitive area: in fact, there exists a minimum width for the screen grid between the photosensitive point and the reading diode 35, but this width is of course only required on the side where this point is read: for example, on the left-hand side (arrow 36) for point 30 of the figure.

The photosensitive point 30 is then formed from an MOS capacity (semiconductor substrate, insulating material and grid 33) forming a first charge collection zone and from a second charge collection zone referenced 38, formed from two parts situated between grid 33 and the insulating barriers 31. In fact, the MOS capacity has a large charge storage capability and so allows good dynamics to be obtained for each photosensitive point, but grid 33 has a greater absorption for small wavelengths, which is overcome with the second charge collection zone. In a variation, a photodiode is formed in this zone 38, for example by doping the substrate, increasing the sensitivity of the point. This photodiode may be formed only in space 38 between grid 33 and insulating barriers 31; it may also extend under grid 33 so as to improve the electric coupling between the MOS capacity and photodiode. These different variations of the second charge collection zone are also applicable to the different embodiments of the photosensitive matrix described further on.

FIG. 3b shows a sectional view of FIG. 3a along line AA, intersecting the photosensitive point 30 at the level of the MOS capacity grid 33.

In this figure, the structure of the device of FIG. 3a appears more clearly: it is formed in a semiconductor substrate 21, covered with an insulating layer 22, two insulating barriers 31 formed by an extra thickness of the insulating material and a reading diode 35 on the right of each of the barriers 31, by doping the substrate. On the insulating layer 22 are deposited screen grids 34 on the border and on the right of the insulating barriers 31. The grid of the MOS capacity 33 extends over the substrate and above screen grids 34, with an insulating layer placed therebetween, not shown for the sake of clarity of the drawing.

The device further comprises a metallization 32 deposited on grid 33, with an insulating layer placed therebetween, above each diode 35 and shown only in FIG. 3b. The purpose of these metal strips 32 is to form an opaque screen to the light radiation which could create parasite charges in the reading diodes 35. They may be formed for example from aluminium. The opaque strip has a width at least equal to that of the reading diodes.

The operation of the device shown in FIG. 3a will be more clearly explained by means of the profile of the surface potential which is shown under the section of FIG. 3b.

In this diagram, the potentials are shown increasing towards the bottom of the diagram, which corresponds to the fact that, applied to an electrode, they create a potential pit for imprisoning the charges.

When a line is not addressed by register 14 (FIG. 1), its potential is at a given value represented by line 23 in the diagram of FIG. 3b, below the grid of the MOS capacity 33, limited on each side by smaller potentials: a potential shown by a line 28, corresponding to the insulating barriers 31, and a constant potential $V_E$ applied to screen grid 34, shown by a line 24, whose value is chosen smaller than the value applied to grid 33 so as to form a potential pit under this grid, in which the charges created by illumination may be stored (hatched zone referenced $\Delta Q$ in the figure). Below the reading diode 35, the potential is, before reading the photosensitive point considered, brought back to a given value illustrated by level 25, by the re-levelling means shown schematically in FIG. 1, the value of this potential having to be higher than that of potential $V_E$ so that there is no invasion by parasite charges of the potential pits situated below the grids 33.

When the photosensitive point considered is, at the same time as all the other photosensitive points of the line to which it belongs, selected by register 14, the potential which is applied to grid 33 is brought to a value close to zero, which is illustrated by line 26 in FIG. 3b: this potential being then less than $V_E$ (line 24), the charges accumulated during the preceding phase are then dumped into diode 35, as shown by an arrow in FIG. 3b, to be removed to one of the line memories 27 or 29; in the example of the figure, the charges are removed through column $c_1$ to line memory 27.

FIG. 4 shows another embodiment of the device of the invention, adapted to the case where reading of the photosensitive zone takes place by means of interlaced half-frames, i.e. by beginning by the half-frame formed by the odd order lines (odd half-frame) then by following with the half-frame formed by the even order lines (even half-frame). In fact, in this case, each of the lines of a device such as shown in FIG. 2 should be split into two so as to obtain for each half-frame an identical signal, which is required for a good quality image on restitution.

In the diagram of FIG. 4, we find again a matrix 1 of six lines (L) and six columns (C) of photosensitive points 15 to each one of which is assigned a color (R, V or B), the green photosensitive points being spaced apart in the same way as previously. The remaining points are spaced so that a line is only two-colored (green and blue or green and red), the color information only varying once every two lines: for example, line $L_1$ comprises alternately a green point and a blue point, and no red point; line $L_2$ comprises alternately red and green points, and no blue point; similarly for line L$_3$; lines L$_4$ and L$_5$ are again alternately blue and green, line L$_6$ being alternately red and green, the point of line L$_1$ and column C$_1$ being for example a blue point.

Moreover, by means of two switching devices 47 and 49, the signal collected on each of the columns may be directed either to line memory 27 or to line memory 29. Thus, by controlling devices 47 and 49 in an appropriate way, described in more detail hereafter, there is obtained in line memory 27 and so at the output of the associated shift register 37, only a signal representing the green chrominance information from which the luminance information can be derived, and in line memory 29 and so at the output of shift register 39, successively a blue line then a red line in the same half-frame. The separation of the colors is then complete and the alternation of red lines then blue lines is adapted to the SECAM process.

Furthermore, contrary to the embodiment of FIG. 2, all the photosensitive points 15 in the same column are, in the embodiment of FIG. 4a, all connected to the same column connection.

In addition there is shown in FIG. 4a a variation which consists in grouping together the column connections in twos between the columns of photosensitive points, which increases the photosensitive area with respect to that which is reserved for reading.

In this embodiment, the switching device 47 is formed by six switching devices, for example MOS transistors, placed respectively in the six columns (C$_1$ to C$_6$), those which are placed in the odd lines, reference 41, being controlled by a potential $\phi_P$ applied to their grid, and those which are placed in the even columns, referenced 42, are controlled by a potential $\phi_I$ also applied to their grid. Similarly, switching device 49 is formed by six MOS transistors inserted in the six columns C$_1$ to C$_6$ respectively, the transistors of the odd columns (43) being controlled by a signal $\phi_I$ and the transistors of the even columns (44), by the signal $\phi_P$. These transistors are biassed like a triode at the time when they are opened by signals $\phi_I$ and $\phi_P$.

In FIG. 4b, potential $\phi_I$ is shown as a function of time; it is a square wave function of period T, varying between a low value referenced V$_B$ and a high value referenced V$_H$, the duration (between times t$_2$ and t$_3$ in the figure) of the upper square wave (V$_H$) being slightly less than T/2. The potential $\phi_P$ is similarly a square wave signal varying between a low value V$_B$ and a high value V$_H$, which are for example equal to those of signal $\phi_I$, the period of $\phi_P$ being equal to period T and the duration (from time t$_5$ to t$_6$) of the upper square wave (V$_H$), less than T/2. The signal $\phi_P$ is in phase opposition with signal $\phi_I$, that is to say that the low square wave (V$_B$) begins at a time t$_0$ before time t$_2$ and that the upper square wave (V$_H$) begins at time t$_5$ after time t$_3$.

The duration of the reading of a frame is equal to T; the reading of the odd frame (lines L$_1$, L$_3$ and L$_5$) is carried out between times t$_1$ and t$_4$, t$_1$ being between t$_0$ and t$_2$ and t$_4$ between t$_3$ and t$_5$, the reading of the even half frame (lines L$_2$, L$_4$ and L$_6$) taking place between times t$_4$ and t$_7$, t$_7$ being similar to time t$_1$; the duration of the odd frame is referenced I in the diagram and the duration of the even half-frame by P.

During the odd half-frame (I), the signal $\phi_I$ is at the high level (V$_H$), which results in the charges stored in the blue and red points of the odd columns being directed to line memory 29 through transistors 43 which, controlled by $\phi_I$ are then enabled, transistors 41 controlled by $\phi_P$ then at the low level preventing access to memory 27. During this same time, the even columns which comprise points sensitive to green in the odd lines are read in the direction of line memory 27 only through transistors 42 which are then enabled, whereas transistors 44 are not.

During the next even half-frame (P), the operation is reversed: the odd columns which comprise in the even lines green points are read in the direction of line memory 27 through transistors 41 which are then enabled, since signal $\phi_P$ is at a high level, whereas signal $\phi_I$ is at a low level, preventing access to line memory 29 (transistors 43 disabled). During this time, reading of the even columns which comprise in the odd lines alternately red and blue points are read in the direction of line memory 29 through enabled transistors 44, the disabled transistors 42 preventing access to line memory 27.

Since each of the lines only comprises points sensitive to green and to one of the other colors only, it is apparent that register 37, connected to memory 27, only receives a signal corresponding to green, whereas line memory 29 and so register 39 supply alternately a blue line and red line. It should be noted that this characteristic is independent of the grouping together of the column connections.

In a variation, not shown, it is possible to split each line of the structure of FIG. 4a into two, one of the lines of the same pair belonging to the odd half-frame and the other to the even half-frame. In the same half-frame, all the green points for example are, from one line to the next, connected at times to the even column connections and at times to the odd ones.

So as to obtain the same result as previously, i.e. with all the green points connected to memory 27 for example, the period (T) of signals $\phi_I$ and $\phi_P$ must no longer be the frame period but the line period.

The advantage of this variation is that then the colored structure of two half-frames is perfectly identical. Furthermore, the vertical resolution may be twice as low for colored filters, these latter then being able to extend over two lines at the same time.

In another variation, not shown, the spacing of the colored filters differs from FIG. 4a in that the green filters are now aligned.

The photosensitive points of the same column are still connected to the same column connection and reading takes place by interlaced half-frames. There is no need for switching devices so as to obtain green at one of the outputs and alternate blue and red lines at the other output.

FIG. 5a shows a top view and FIG. 5b a sectional view of one embodiment of a photosensitive points matrix in which the grouping together of the column connections shown in FIG. 4a is carried out.

The differences with the matrix shown in FIG. 3a are then to be found at the level of the charge collection columns. We find again then in FIG. 5a grids 33, separated from each other by insulating barriers 51 formed as before. Between grids 33 and insulating barriers 51 are situated zones 38 in which photodiodes are formed, in the variation shown. One of the photosensitive points thus formed is surrounded by a thick line and referenced 50 in FIG. 5a: it belongs to line L$_i$ and to column C$_i$ and the charges which it stores are read leftwards as shown by an arrow 56.

As shown in FIG. 5a, the reading columns are grouped in twos on each side of a vertical insulating barrier, also referenced 51. We find then on each side of the insulation 51, two column diodes referenced 35 and formed as before, for example in substrate 21 (FIG. 5b). The screen grid is now referenced 54 and covers both the insulating barrier 51 and the two reading diodes 35 which are situated on each side of barrier 51. As can be seen more clearly in FIG. 5b, the grid of each MOS capacity 33 covers substrate 21 and screen grids 54, with interpositioning of an insulating layer. As before, an opaque layer 32 is placed above the reading diodes 35; in the present case, a single layer 32 is deposited for the two reading diodes situated on each side of the same barrier 51.

By way of example, there is shown in FIG. 5b the case where, in zones 38, photodiodes are formed which also extend under the grid of each MOS capacity 33, outside the zones occupied by the screen grids 54 and the insulating barriers 51.

Finally, of course, the horizontal insulating barriers 51 are interrupted at the level of the reading diodes 35.

The operation of such a photosensitive point is similar to the one described for FIG. 3.

This grouping together of the columns provides a fairly considerable increase in sensitivity, because the available surface for the photosensitive points is greater: in fact, two directly adjacent photosensitive points are only separated by a vertical insulating barrier 51 which may be very thin and which has not to be covered by an opaque deposit such as 32.

FIG. 6a shows a variation of the embodiment of FIG. 4a in which the double column is replaced by a single column, the insulation between the photosensitive points being provided by independent screen grids.

In FIG. 6a, we find again then the photosensitive matrix 1 which comprises for example six lines ($L_1$ to $L_6$) and eight columns ($C_1$ to $C_8$), the colored filters being spaced in the same way as in FIG. 4a, and the two line memories 27 and 29 situated on each side of matrix 1, connected respectively to the two shift registers 37 and 39.

The device comprises here two switching elements 67 and 69 inserted respectively before the line memories 27 and 29. Columns $C_1$ to $C_8$ which form the photosensitive points are connected in twos to the same column connection ($c_1$ to $c_4$ in the figure), which comprises a reading diode 35, illustrated in FIG. 6a by a simple connection, surrounded by two screen grids on each side of the reading diode 35, these grids being referenced 64 for column $C_1$ and 74 for column $C_2$. The screen grids such as 64, which correspond to odd columns ($C_1$, $C_3$, $C_5$, $C_7$), are connected to a potential $\phi_G$ and the screen grids such as 74 connected to even columns ($C_2$, $C_4$, $C_6$ and $C_8$) are connected to a potential $\phi_D$. The reading diodes 35 are connected, at each of their ends, respectively to memories 27 and 29 through transistors 61 and 62, controlled respectively by potentials $\phi_B$ and $\phi_H$, these transistors forming respectively the switching devices 67 and 69.

FIG. 6b shows the form of the control signals $\phi_B$, $\phi_H$, $\phi_G$ and $\phi_D$ used in the device of FIG. 6a, which are voltages changing between high level and a low level.

During the line return duration D, between times $t_8$ and $t_{11}$, the signal $\phi_B$ is only high between time $t_8$ and a time $t_9$, $t_9-t_8$ being slightly less than D/2; the signal $\phi_H$ is only high between a time $t_{10}$ and time $t_{11}$, with $t_{11}-t_{10}$ slightly less than D/2; signals $\phi_G$ and $\phi_D$ have respectively the same shape as signals $\phi_B$ and $\phi_H$.

The operation of the device is as follows.

For one of the half-frames, even or odd, we have for example signals $\phi_B$ at the high level at the same time as signal $\phi_G$, so that the charges stored in the photosensitive points of odd columns (C) will be switched towards line memory 27, transistors 61 controlled by $\phi_B$ being then enabled. During the same period, with signal $\phi_D$ at the low level, the even columns are isolated from diodes 35 by the screen grid 74, and access to line memory 29 is closed by transistors 62, controlled by signal $\phi_H$ which are not enabled. At time $t_{10}$, signals $\phi_B$ and $\phi_G$ have come back to the low level whereas the signals $\phi_H$ and $\phi_D$ are at the high level and the operation is then the reverse of the preceding one, i.e. that it is the charges stored in the photosensitive points of the even columns which are read out by diode 35 and they are directed to line memory 29 exclusively through transistors 62, the only ones enabled.

During the next half-frame, so as to obtain an operation similar to what was explained in FIG. 4b, it is necessary to reverse one of the pair of signals $\phi_B$-$\phi_H$ or $\phi_G$-$\phi_D$: for example, it is possible to maintain $\phi_B$ and $\phi_H$ at the high level in the same order, but then $\phi_D$ must be in phase with $\phi_B$ and $\phi_G$ must be in phase with $\phi_H$.

Moreover, in a similar way as was described for FIG. 4a, it is possible to split each line of matrix 1 into two, by adapting the control signals more especially so as obtain perfectly identical colored structures from one half-frame to the other.

FIG. 7a shows a top view and FIG. 7b a sectional view of one embodiment of a photosensitive matrix able to be used in the device of FIG. 6a.

This structure only differs from that of FIG. 5a at the level of the charge collecting columns. We find again then the photosensitive point 50 constituted by an MOS capacity formed by grid 33, the semiconductor substrate 21 and insulator 22, and a zone 38 in which a photodiode has been formed which extends for example also under grid 33, limited by elements 51 and 74, as shown in the section of FIG. 7b, formed in the device of FIG. 7a along a line CC, at the level of the photosensitive point 50 and of grid 33. As previously, the reading of this point takes place leftwards (arrow 56).

The charge collection column is here formed by a column diode 35 partly covered by the screen grid 64, this latter also extending above substrate 21 at the left of reading diode 35. The screen grid 74 covers the other part of the diode 35, extends over a part of the substrate situated at the right of this diode and also extends, with interpositioning of an insulating layer, above the screen grid 64. As before, the whole is covered by grid 33, above which there is further disposed the opaque layer 32 with interpositioning of an insulating layer at the level of diode 35.

The advantage of the structure such as described in FIGS. 6 and 7 is the suppression of insulation between two columns and, consequently, an increase in sensitivity. By way of example, this increase may reach 30% with respect to a structure such as that shown in FIG. 3.

The invention is not limited to the embodiments described above but covers all the variations within the scope of a man skilled in the art. Thus, the arrangement of the colored filters has been described with the three usual colors green, blue, red but may of course be applied to three colors complementary to the preceding ones, or to other groups of three colors such as green, yellow and white, or green, yellow and cyan for example.

What is claimed is:

1. A device for analysing color images, using electric charge transfer, comprising:
   a photosensitive assembly, comprising:
      a plurality of elementary photosensitive zones, called points, in which electric charges are created depending on the degree of illumination received, formed on the same semiconductor substrate in N lines and M columns and insulated from each other, forming a matrix, each of these elementary zones comprising an MOS capacity forming a first charge collection zone and comprising a grid which is common to the capacities of the same line, and a second charge collection zone, electrically coupled to the capacity, the whole of the point receiving a colored filter for making it sensitive only to one predefined color,
      connection and control means for supplying in parallel through column connections electric charges created in the M points of the same line, successively for the N lines, these means comprising a plurality of reading diodes, arranged in columns between the points so as to receive each one, sucessively, to order, the charges from at least two points belonging to at least two different lines,
      means forming a screen for the charges, placed between each of the points and the connection means, these screen means comprising a plurality of grids brought to a constant potential at least during transfer of charges from the photosensitive points in the connection means and arranged in columns between the reading diodes and the points,
      an assembly of two memories called line memories, formed in the same semiconductor substrate, receiving in parallel the electric charges supplied by the connection and control means, so that each point of the matrix is assigned to one only of the two line memories, one of these memories being connected only to points of the same color,
      an assembly of two analog shift registers receiving in parallel respectively the charges supplied by the two line memories and each delivering in series an electric analysis signal of the image.

2. The device as claimed in claim 1, wherein the colored filters placed respectively at the photosensitive points make these latter sensitive respectively to a first, second and third color, one of the line memories being connected only to points of the first color.

3. The device as claimed in claim 2, wherein the points of the same line are arranged in the first-third-first-second color sequence, the points of the first color being placed in a staggered arrangement from one line to the next, the points of the same column being connected alternately to the column connections situated at the right and at the left of the points column considered, so that one of the line memories is connected only to points of the first color, the other line memory being connected at one and the same time to points of the other two colors.

4. The device as claimed in claim 3, wherein the means forming screen comprise a grid in the shape of a strip per column brought to a constant potential, the reading diodes being also in strip shape, of a width less than the preceding ones, formed in the semiconductor substrate under each of the screen grids, the insulation of the photosensitive points with respect to each other being provided horizontally between two MOS capacity grids, continuously except at the level of the reading diodes and vertically continuously, in the form of a crenel or indentation about each of the photosensitive points.

5. The device as claimed in claim 2, wherein the points of the same line are alternately of the first and second colors, for two successive lines, then of the first and third colors for the next two lines and so on, the points of the first color being placed in a staggered arrangement from one line to the next, the points in the same column being connected together to the two line memories through respectively two switching devices, ensuring that, for odd lines, odd columns are assigned to one of the line memories and even columns to the other of the memories, the procedure being reversed for the even lines, so that one of the memories receives charges only from points of the first color and the other memory receives lines each comprising only one of the other colors, alternately.

6. The device as claimed in claim 2, wherein the points of the same line are alternately of the first and second colors, for two successive lines, then of the first and third colors for the two next lines, and so on, the points of the first color being placed in columns, the points of the same column being connected together to one of the two line memories, one of the memories receiving charges only from the points of the first color and the other memory receiving lines only comprising a single one of the other colors, alternately.

7. The device as claimed in claim 5, or 6, wherein the column connections are grouped together in twos between the points columns.

8. The device as claimed in claim 7, wherein the screen forming means comprise a grid in the form of a strip per column brought to a constant potential, the reading diodes being also strip shaped, of a width less than the preceding ones, formed in the semiconductor substrate and brought together in twos under each of the screen grids, the insulation of the photosensitive points with respect to each other being provided horizontally between two MOS capacity grids, continuously except at the level of the reading diodes and vertically continuously between two adjacent reading diodes and between two adjacent photosensitive points.

9. The device as claimed in claim 5, wherein the connection means only comprise a single column connection for two points columns and a single reading diode in strip form, the means forming screen comprising a grid per column, the two grids relative to the same diode being subjected to phase opposition potentials so as to carry out sequentially the reading of the points connected to the same column connection, the column connections being connected to the two line memories through respectively two switching devices ensuring for the same line switching of charges to one of the line memories depending on the point from which they come.

10. The device as claimed in claim 1, wherein the second charge collection zones of each photosensitive point are situated in locations of the photosensitive point left free by the screen grid and the MOS capacity grid.

11. The device as claimed in claim 1, wherein each of the second charge collection zones is formed by a diode.

12. The device as claimed in claim 11, wherein the diode further extends under the grid of the MOS capacity of each of the photosensitive points.

13. The device as claimed in claim 1, wherein the insulation comprises an extra thickness of the insulating layer covering the semiconductor substrate.

14. The device as claimed in claim 13, wherein the insulation further comprises overdoping of the semiconductor substrate, effected under the extra thickness of the insulating layer.

15. The device as claimed in claim 1, wherein there is further provided a strip opaque to the light image, of a width at least equal to that of the reading diodes, deposited above the screen grid for each column connection.

16. The device as claimed in claim 15, wherein the strip opaque to the light image is formed from aluminium.

17. The device as claimed in claim 2, wherein the first, second and third colors are respectively green, blue and red.

18. The device as claimed in claim 1, wherein the shift registers are charge transfer registers of the CCD type.